United States Patent

Nakauchi

[19]

[11] Patent Number: 6,040,710
[45] Date of Patent: Mar. 21, 2000

[54] CML-CMOS CONVERSION CIRCUIT

[75] Inventor: Osamu Nakauchi, Tokyo, Japan

[73] Assignee: NEC Corporation, Tokyo, Japan

[21] Appl. No.: 09/092,012

[22] Filed: Jun. 4, 1998

[30] Foreign Application Priority Data

Jun. 5, 1997 [JP] Japan .................................. 9-148104

[51] Int. Cl.[7] .............................................. H03K 19/0175
[52] U.S. Cl. .............................. 326/66; 326/64; 326/74; 326/110
[58] Field of Search .................................. 326/66, 64, 73, 326/77, 63, 84, 110, 127, 126, 67, 74

[56] References Cited

U.S. PATENT DOCUMENTS

| | | | |
|---|---|---|---|
| 5,283,482 | 2/1994 | Chen | 326/66 |
| 5,459,412 | 10/1995 | Mentzer | 326/66 |
| 5,528,171 | 6/1996 | Doi et al. | 326/66 |

FOREIGN PATENT DOCUMENTS

| | | |
|---|---|---|
| 60-180218 | 9/1985 | Japan . |
| 62-159516 | 7/1987 | Japan . |
| 2-150121 | 6/1990 | Japan . |
| 4-172713 | 6/1992 | Japan . |
| 6-196995 | 7/1994 | Japan . |

*Primary Examiner*—Michael Tokar
*Assistant Examiner*—Daniel D. Chang
*Attorney, Agent, or Firm*—McGinn & Gibb, P.C.

[57] ABSTRACT

A CML-CMOS conversion circuit according to this invention includes: a differential circuit in which resistance is connected as load; a first current mirror circuit made up from an n-channel MOS transistor connected to one output of the differential circuit; a second current mirror circuit made up from an n-channel MOS transistor connected to the other output of the differential circuit; a third current mirror circuit made up of two p-channel MOS transistors connected in series to the first current mirror circuit and the second current mirror circuit; and a CMOS inverter that takes as input the output signal of the second current mirror circuit and that outputs a signal at CMOS logic amplitude.

6 Claims, 3 Drawing Sheets

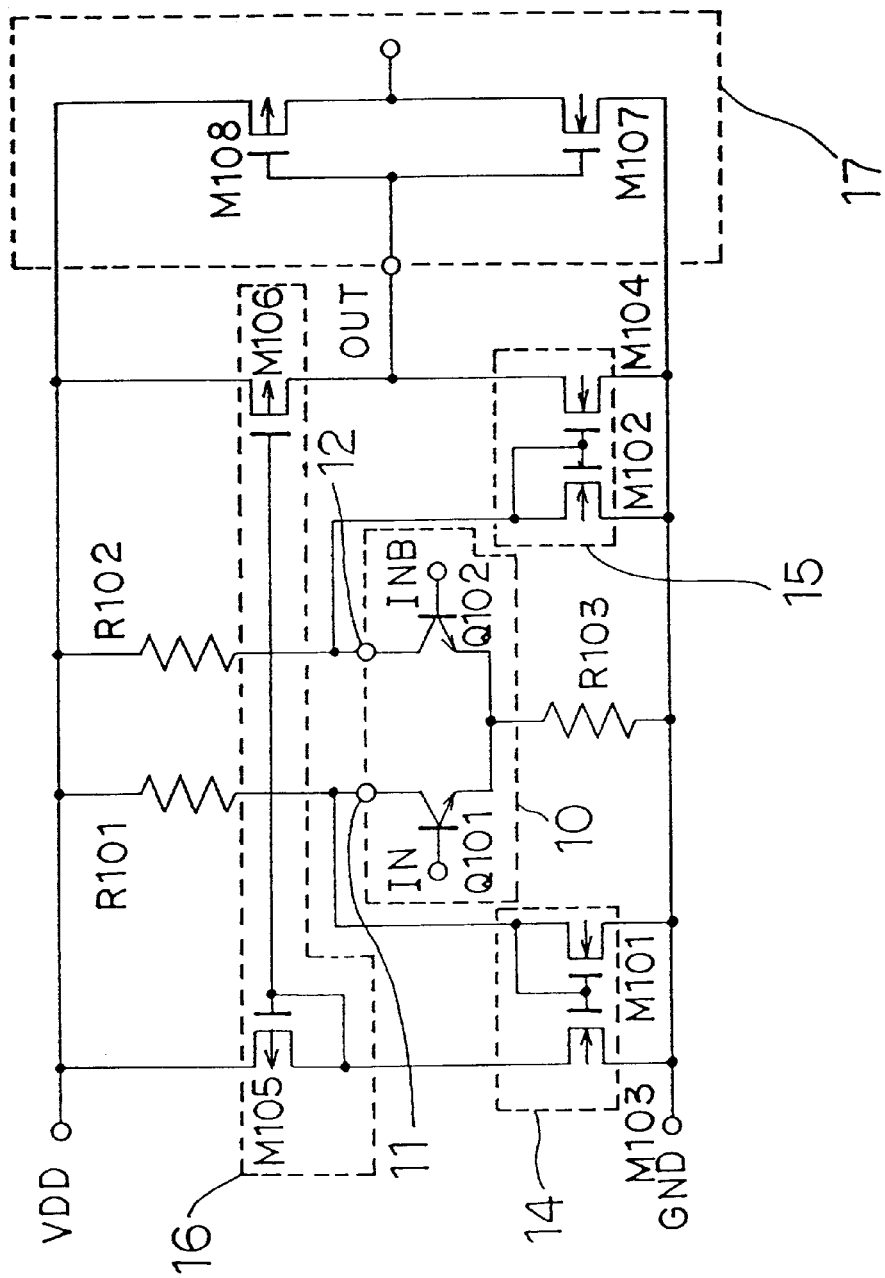
F I G. 3

CM L-CMOS CONVERSION CIRCUIT

BACKGROUND OF THE INVENTION

1. Field of the Invention

The present invention relates to a CML-CMOS conversion circuit that converts the voltage amplitude of a CML (Current Mode Logic) circuit to the voltage amplitude of a CMOS (Complementary Metal Oxide Semiconductor) circuit.

2. Description of the Related Art

In devices such as portable terminals that operate on one battery, recent years have seen a growing demand not only for lower power consumption but for the higher-speed operation that accompanies higher frequencies of used lines. Circuits incorporated in these types of devices therefore have adopted a BICMOS (Bipolar-CMOS) configuration in which bipolar transistors capable of high-speed operation and CMOS (Complementary Metal-Oxide Semiconductor) circuits that are more advantageous for lower power consumption are formed on the same chip. There has consequently been a need for CML-CMOS conversion circuits in circuits in which the BICMOS configuration is adopted, these CML-CMOS conversion circuits serving as interface circuits between CML (Current Mode Logic) circuits that are formed by bipolar transistors and that operate at CML amplitude and CMOS circuits that operate at CMOS logic amplitude. One example of such a CML-CMOS conversion circuit is shown in FIG. 1.

In FIG. 1, differential circuit 20 is constituted by two bipolar transistors Q201 and Q202 having emitters connected in common, the emitter of bipolar transistor Q201 and the emitter of bipolar transistor Q202 each being connected to ground potential GND by way of resistor R203, which determines the current flowing in each. While FIG. 1 shows a configuration in which the current flowing in differential circuit 20 is determined by resistor R203, a constant-current regulated power supply circuit that is made up of transistors may also be used in place of resistor R203. The collector of bipolar transistor Q201 is a first differential output terminal 21 and is connected to power supply VDD by way of resistor R201. The collector of bipolar transistor Q202 is a second differential output terminal 22 and is connected to power supply VDD by way of resistor R202.

In addition, second differential output terminal 22 is connected to ground potential GND by way of bipolar transistor Q203 in which the collector and base are connected. Current mirror circuit 24 is formed by connecting in common the bases of bipolar transistor Q203 and bipolar transistor Q204. The emitter of bipolar transistor Q204 is grounded, and the collector of bipolar transistor Q204 is connected to power supply VDD by way of resistor R204.

The collector of bipolar transistor Q204 is connected to output terminal OUT, and output terminal OUT is connected to the input of CMOS inverter 27, which is made up of p-channel MOS transistor M202 and n-channel MOS transistor M201.

Explanation is next presented regarding the operation of the CML-CMOS conversion circuit shown in FIG. 1 and having the above-described configuration.

First, when a high-level signal is inputted at CML amplitude to positive input terminal IN of differential circuit 20 and a low-level signal is inputted at CML amplitude to inverted input terminal INB of differential circuit 20, bipolar transistor Q201 connected to positive input terminal IN enters a conductive state, and bipolar transistor Q202 connected to inverted input terminal INB enters a nonconductive state, whereupon current flows to bipolar transistor Q201 from power supply VDD by way of resistor R201, which is load resistance, and a low-level signal is outputted from first differential output terminal 21. In addition, since bipolar transistor Q202 is in a nonconductive state, a high-level signal is outputted from second differential output terminal 22, bipolar transistor Q203 and bipolar transistor Q204 each enter a conductive state, and a low-level signal is outputted from output terminal OUT.

On the other hand, when a low-level signal at CML amplitude is inputted to positive input terminal IN of differential circuit 20 and a high-level signal at CML amplitude is inputted to inverted input terminal INB of differential circuit 20, bipolar transistor Q201 connected to positive input terminal IN enters a nonconductive state and bipolar transistor Q202 connected to inverted input terminal INB enters a conductive state. In this case, current flows to bipolar transistor Q202 from power supply VDD by way of resistor R202, which is load resistance, and a low-level signal is outputted from second differential output terminal 22. In addition, since bipolar transistor Q201 is in a nonconductive state, a high-level signal is outputted from first differential output terminal 21. When a low-level signal is outputted from second differential output terminal 22, bipolar transistors Q203 and Q204 each enter a nonconductive state and a high-level signal is outputted from output terminal OUT.

CMOS inverter 27 outputs a high-level signal at CMOS logic amplitude when output terminal OUT is at low level, and outputs a low-level signal at CMOS logic amplitude when output terminal OUT is at high level.

Explanation is next presented regarding another CML-CMOS conversion circuit of the prior art with reference to FIG. 2.

In FIG. 2, differential circuit 30 is made up of two bipolar transistors Q301 and Q302 having emitters connected in common, and the emitter of bipolar transistor Q301 and the emitter of bipolar transistor Q302 are connected to ground potential GND by way of resistor R301, which determines the current flowing to each. FIG. 2 shows a configuration in which the current that flows to differential circuit 30 is determined by resistor R301, but a constant-current regulated power supply circuit that is made up of transistors may also be used in place of resistor R301. The collector of bipolar transistor Q301 (first differential output terminal 31) is connected to power supply VDD by way of p-channel MOS transistor M301 in which the gate and drain are connected, and the collector of bipolar transistor Q302 (second differential output terminal 32) is connected to power supply VDD by way of p-channel MOS transistor M302 in which the gate and drain are connected.

Connecting the gate of p-channel MOS transistor M301 in common with the gate of p-channel MOS transistor M303 produces first current mirror circuit 34. The source of p-channel MOS transistor M303 is connected to power supply VDD, and the drain of p-channel MOS transistor M303 is connected to ground potential GND by way of n-channel MOS transistor M305 in which the drain and gate are connected.

In addition, connecting the gate of p-channel MOS transistor M302 in common with the gate of p-channel MOS transistor M304 produces second current mirror circuit 35. The source of p-channel MOS transistor M304 is connected to power supply VDD, and the drain of p-channel MOS transistor M304 is connected to ground potential GND by way of n-channel MOS transistor M306. With their gates connected in common, n-channel MOS transistor M305 and n-channel MOS transistor M306 make up third current mirror circuit 36.

The drain of p-channel MOS transistor M304 is connected to output terminal OUT, and output terminal OUT is connected to the input of CMOS inverter 37, which is made up from p-channel MOS transistor M308 and n-channel MOS transistor M307.

Next, regarding the operation of the CML-CMOS conversion circuit shown in FIG. 2 configured as described hereinabove, first, when a high-level signal at CML amplitude is inputted to positive input terminal IN of differential circuit 30 and a low-level signal at CML amplitude is inputted to inverted input terminal INB, bipolar transistor Q301 connected to positive input terminal IN enters a conductive state and bipolar transistor Q302 connected to inverted input terminal INB enters a nonconductive state. Since bipolar transistor Q302 is in a nonconductive state, a high-level signal is then outputted from second differential output terminal 32 and p-channel MOS transistors M302 and M304 both enter a nonconductive state. In addition, because bipolar transistor Q301 is in a conductive state, a low-level signal is outputted from first differential output terminal 31, p-channel MOS transistors M301 and M303 both enter a conductive state, and a high-level signal is outputted from the drain (terminal 33) of p-channel MOS transistor M303. Accordingly, n-channel MOS transistors M305 and M306 both enter a conductive state, and a low-level signal is outputted from output terminal OUT.

On the other hand, when a low-level signal at CML amplitude is inputted to positive input terminal IN of differential circuit 30 and a high-level signal at CML amplitude is inputted to inverted input terminal INB, bipolar transistor Q301 connected to positive input terminal IN enters a nonconductive state and bipolar transistor Q302 connected to inverted input terminal INB enters a conductive state. A high-level signal is then outputted from first differential output terminal 31, each of p-channel MOS transistors M301 and M303 enter a nonconductive state, and each of n-channel MOS transistors M305 and M306 enters a nonconductive state. In addition, since bipolar transistor Q302 is in a conductive state, a low-level signal is outputted from second differential output terminal 32, p-channel MOS transistors M302 and M304 both enter a conductive state, and a high-level signal is outputted from output terminal OUT.

CMOS inverter 37 outputs a high-level signal at CMOS logic amplitude when output terminal OUT is at low level, and outputs a low-level signal at CMOS logic amplitude when output terminal OUT is at high level.

In the CML-CMOS conversion circuit shown in FIG. 2, variations occur in the current flowing to differential circuit 30 because MOS transistors are connected to the output of differential circuit 30. Nevertheless, the voltage amplitude inputted to CMOS inverter 37 is stable because the output voltage of output terminal OUT is determined by the conductive/nonconductive states of p-channel MOS transistor M304 and n-channel MOS transistor M306.

The threshold voltage $V_T$ of a CMOS transistor is generally 0.55 [V] for an n-channel MOS transistor and 0.65 [V] for a p-channel MOS transistor, with a variation originating in fabrication of ±10.15 [V].

In addition, the direct-current current amplification factor $h_{FE}$ of a bipolar transistor is on the order of 100 at typical value (typical value), with a variation of ½ to double the typical value originating in fabrication. Moreover, variation in the resistance of resistors resulting in fabrication is on the order of ±15% the typical value.

The effect on the CML-CMOS conversion circuits of the prior art shown in FIG. 1 and FIG. 2 resulting from such variation for each circuit element is next examined, beginning with an examination of the effect on the CML-CMOS conversion circuit shown in FIG. 1.

In the CML-CMOS conversion circuit shown in FIG. 1, output signals are received from only one of the differential output terminals (second differential output terminal 22) of differential circuit 20. In such a case, the output voltage of output terminal OUT is determined by the output voltage of second differential output terminal 22, and as a result, higher accuracy is demanded of each circuit element than in a configuration in which output signals are taken from each of two differential output terminals 31 and 32 as in the CML-CMOS conversion circuit shown in FIG. 2. In particular, variation originating in fabrication in the threshold voltage $V_T$ of the MOS transistors has the greatest effect on operation of the CMOS inverter.

As described hereinabove, the maximum variation in threshold voltage $V_T$ is 0.55 [V]+0.15 [V]=0.70 [V] for an n-channel MOS transistor and 0.65 [V]+0.15 [V]=0.80 [V] for a p-channel MOS transistor.

In this case, in order for CMOS inverter 27 to operate when the voltage of power supply VDD is 1.0 [V], the output voltage of output terminal OUT must be made 0.2 [V] or less and p-channel MOS transistor M202 be placed in a conductive state, and, the output voltage of output terminal OUT must be made 0.7 [V] or greater and n-channel MOS transistor M201 be placed in a conductive state.

When the voltage $V_{CE}$ across the collector and emitter of bipolar transistor Q204 is 0.2 [V] or less, however, bipolar transistor Q204 operates in a saturated state. As a result, conduction by the parasitic pnp transistor allows current to flow to the substrate, thereby causing a decrease in the apparent direct-current current amplification factor $h_{FE}$ and a drop in the frequency characteristic, and high-speed operation is prevented.

In addition, latch-up occurs when current flows to the parasitic pnp transistor because the potential of the substrate becomes higher than the ground potential.

However, in the configuration of CML-CMOS conversion circuit shown in FIG. 1, enlarging the transistor size of p-channel MOS transistor M202 in CMOS inverter 27 and increasing the drain current enables p-channel MOS transistor M202 to be placed in a conductive state even if the output voltage of output terminal OUT is not 0.2 [V] or less.

Nevertheless, increasing the transistor size causes more current than necessary to flow to CMOS inverter 27, and this in turn causes the frequency characteristic to drop due to the capacitance of the p-channel MOS transistor itself, and high-speed operation is therefore prevented.

If the resistance value of resistor R204 is set such that the current (conductive state) flowing to bipolar transistor Q204 is 10 [µA] at the typical value, direct-current current amplification factor $h_{FE}$ becomes ½ the typical value when at a minimum, whereby the minimum current flowing to bipolar transistor Q204 becomes 5 [µA]. The voltage drop of resistor R204 must then be made 0.8 [V] or more in order to place p-channel MOS transistor M202 in a conductive state.

In other words, the resistance of resistor R204 becomes:

0.8 [V]/5 [µA]=160 [KΩ].

In such a case, if variations in resistance are taken into consideration, the value of resistor R204 must be made:

160 [KΩ](typical value)/0.85(variation)=188 [KΩ]

If resistor R204 is made 188 [KΩ], however, the occurrence of variations in the direction of increase in direct-current current amplification factor $h_{FE}$ and the resistance value may cause the voltage drop due to resistor R204 to become: 20 [μA] {2(variation in direct-current current amplification factor $h_{FE}$)×10 [μA]}×216 [kΩ]{188 [KΩ]× 1.15(variation of the resistance value)}=4.32 [V]. As a result, only low level is outputted from output terminal OUT, and moreover, bipolar transistor Q204 operates in a saturated state, whereby the frequency characteristic drops and high-speed operation becomes impossible.

As described hereinabove, in the configuration shown in FIG. 1, the output voltage of output terminal OUT is determined by the resistance value of resistor R204 and the current flowing to the resistor. As a consequence, the resulting circuit is highly sensitive to fluctuations in the values of resistor R 204 and the direct-current current amplification factor $h_{FE}$ of bipolar transistor Q204.

In addition, because bipolar transistor Q204 operates in a saturated state, there is the problem that the frequency characteristic of the CML-CMOS conversion circuit drops precipitously and high-speed operation is prevented.

On the other hand, in the CML-CMOS conversion circuit shown in FIG. 2, p-channel MOS transistors are employed as the load of differential circuit 30, and as a result, when large variation occurs in the threshold voltage $V_T$ of p-channel MOS transistors M301 and M302 (a maximum of 0.8 [V], the output voltage (when bipolar transistors Q301 and Q302 are in a conductive state) of first differential output terminal 31 and second differential output terminal 32 must be made 0.2 [V] when the voltage of power supply VDD is made 1. Bipolar transistors Q301 and Q302 then operate in a saturated state, whereby a drastic drop occurs in the frequency characteristic and high-speed operation is prevented.

However, enlarging the transistor size of p-channel MOS transistors M301 and M302 and increasing the drain current allows operation without problems despite a high output voltage of first differential output terminal 31 and second differential output terminal 32 (when bipolar transistors Q301 and Q302 are in a conductive state). Nevertheless, the capacitance of the p-channel MOS transistors themselves increases in such a case, whereby the frequency characteristic drops and high-speed operation is prevented.

Decreasing the gain of differential circuit 30 can be considered as one method of improving the frequency characteristic. In such a case, the current flowing to p-channel MOS transistors M301 and M302 decreases and problem-free operation is enabled despite high output voltage of first differential output terminal 31 and second differential output terminal 32 (when bipolar transistors Q301 and Q302 are in a conductive state). Nevertheless, the decrease in current flowing to bipolar transistors Q301 and Q302 of differential circuit 30 in this case causes the frequency characteristic of differential circuit 30 to drop and prevents high-speed operation.

In other words, in the CML-CMOS conversion circuit of the prior art shown in FIG. 1 and FIG. 2, there is the problem that, due to the effect of variations in circuit elements, a drastic drop occurs in the frequency characteristic and high-speed operation is rendered impossible in cases in which the power supply voltage is low (for example, if the battery voltage is 1 [V]. In addition, there is the problem that the transistors making up the circuit may cause latch-up.

SUMMARY OF THE INVENTION

The object of the present invention is therefore to provide a CML-CMOS conversion circuit that does not give rise to latch-up, and moreover, that operates at high speed even in the case of low power-supply voltage.

To achieve the above-described object, the CML-CMOS conversion circuit of the present invention comprises:

a differential circuit that is connected to resistors as load, and that amplifies and complementary-outputs the difference in potential between a positive input signal and an inverted input signal;

a first current mirror circuit that is connected to one output of the differential circuit;

a second current mirror circuit that is connected to the other output of the differential circuit;

a third current mirror circuit that is provided with a first transistor connected in a series to the output of the first current mirror circuit and a second transistor connected in a series with the output of the second current mirror circuit, wherein the second transistor enters a conductive state when current flows to the first transistor and the second transistor enters a nonconductive state when current does not flow to the first transistor; and a CMOS inverter that is provided with a p-channel MOS transistor and an n-channel MOS transistor that are in complementary connection, that takes as input a signal outputted from the second current mirror circuit, and that outputs a signal of CMOS logic amplitude.

In a CML-CMOS conversion circuit configured according to the foregoing description, the output voltage of the differential circuit can be easily set to a low value because resistors are used as the load of the differential circuit.

Here, in contrast with a configuration in which the output of the differential circuit is received by bipolar transistors, the use of n-channel MOS transistors to make up first current mirror circuit and second current mirror circuit eliminates the degradation of the frequency characteristic or the occurrence of latch-up brought about by saturation of the bipolar transistor.

The above and other objects, features, and advantages of the present invention will become apparent from the following description based on the accompanying drawings which illustrate an example of a preferred embodiment of the present invention.

BRIEF DESCRIPTION OF THE DRAWINGS

FIG. 3 is a circuit diagram showing the configuration of a CML-CMOS conversion circuit of the present invention.

DETAILED DESCRIPTION OF THE PREFERRED EMBODIMENTS

Figure 1:
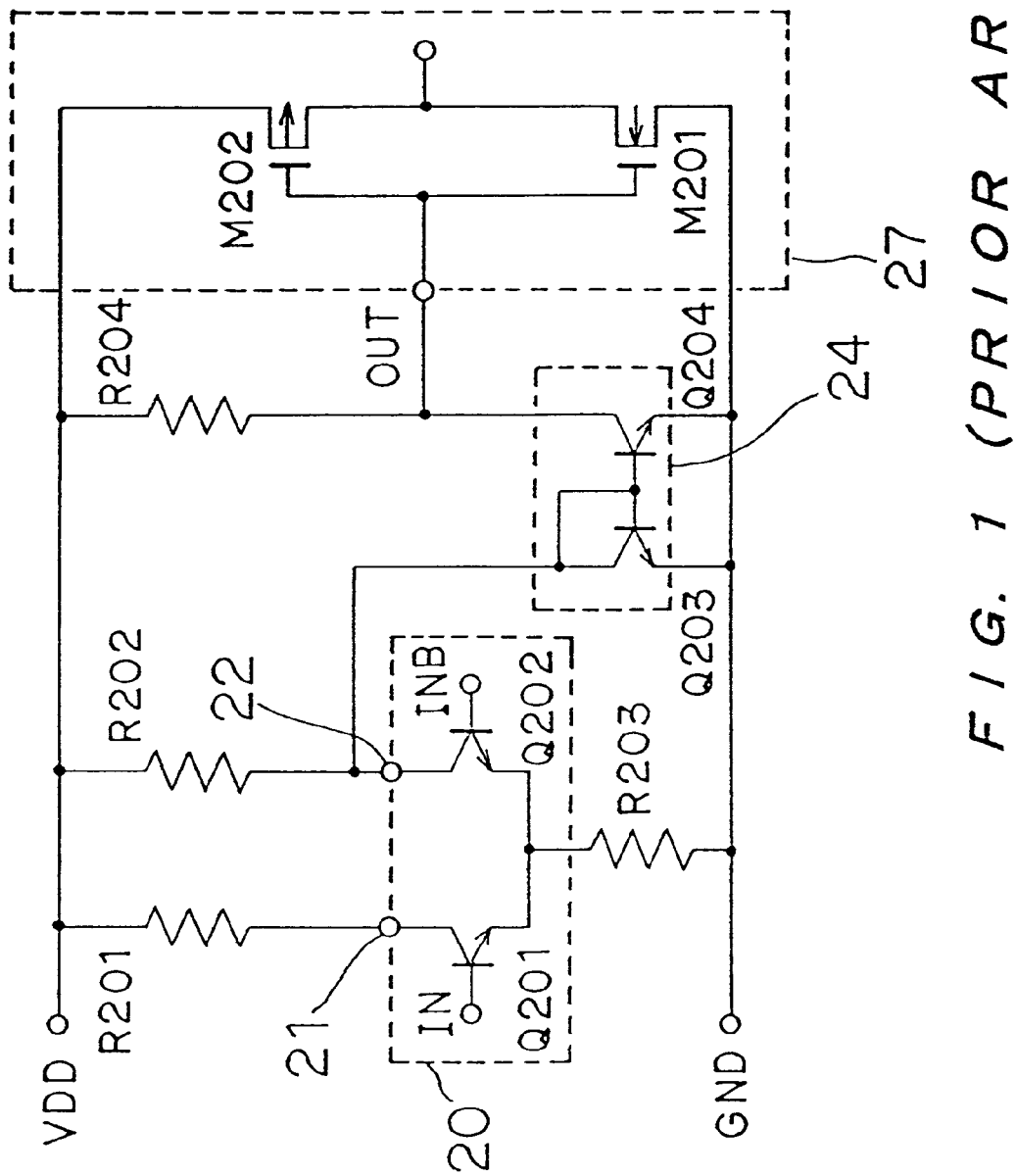
FIG. 1 is a circuit diagram showing one example of the configuration of a CML-CMOS conversion circuit of the prior art.

The present invention is next described with reference to FIG. 3.

In FIG. 3, differential circuit 10 is made up of two bipolar transistors Q101 and Q102 having emitters connected in common, the emitter of bipolar transistor Q101 and the emitter of bipolar transistor Q102 being connected to ground potential GND by way of resistor R103 that determines the current that flows to each. FIG. 3 shows a configuration in which the current that flows to differential circuit 10 is determined by resistor R103, but a constant-current current regulation power supply made up from transistors may also be used in place of resistor R103. The collector of bipolar transistor Q101 (first differential output terminal 11) is connected to power supply VDD by way of resistor R101, and the collector of bipolar transistor Q102 (second differential output terminal 12) is connected to power supply VDD by way of resistor R102.

First differential output terminal 11 is connected to ground potential GND by way of n-channel MOS transistor M101 in which the drain and gate are connected. First current mirror circuit 14 is formed by connecting in common the gates of n-channel MOS transistor M101 and n-channel MOS transistor M103. The source of n-channel MOS transistor M103 is grounded, and the drain of n-channel MOS transistor M103 is connected to power supply VDD by way of p-channel MOS transistor M105 in which the drain and gate are connected.

Second differential output terminal 12 is connected to ground potential GND by way of n-channel MOS transistor M102 in which the drain and gate are connected. Second current mirror circuit 15 is formed by connecting in common the gates of n-channel MOS transistor M102 and n-channel MOS transistor M104. The source of n-channel MOS transistor M104 is grounded, and the drain of n-channel MOS transistor M104 is connected to power supply VDD by way of p-channel MOS transistor M106. Third current mirror circuit 16 is formed by connecting in common the gates of p-channel MOS transistor M105 and p-channel MOS transistor M106.

The drain of p-channel MOS transistor M106 is connected to output terminal OUT, and output terminal OUT is connected to the input of CMOS inverter 17, which is made up of p-channel MOS transistor M108 and n-channel MOS transistor M107.

Regarding the operation of the CML-CMOS conversion circuit shown in FIG. 3 configured according to the foregoing description, if the current (conductive state) that flows to bipolar transistors Q101 and Q102 that make up differential circuit 10 is $I_Q$, the current (conductive state) that flows to n-channel MOS transistors M101 and M102 is $I_M$, the values of resistors R101–R103 are set so as to satisfy the relation $I_Q > I_M$.

The values of resistors R101–R103 are set such that n-channel MOS transistor M101 enters a nonconductive state in accordance with the voltage drop that occurs by the flow of current $I_Q$ to resistor R101 when bipolar transistor Q101 is in a conductive state. In addition, n-channel MOS transistor M102 enters a nonconductive state in accordance with the voltage drop that occurs by the flow of current $I_Q$ to resistor R102 when bipolar transistor Q102 is in a conductive state.

When a high-level signal at CML amplitude is inputted to positive input terminal IN of differential circuit 10 and a low-level signal at CML amplitude is inputted to inverted input terminal INB in a state in which the values of resistors R101–R103 have been set as described hereinabove, bipolar transistor Q101 connected to positive input terminal IN enters a conductive state and bipolar transistor Q102 connected to inverted input terminal INB enters a nonconductive state. Current then flows from power supply VDD to bipolar transistor Q101 by way of resistor R101, which is the load resistance, and a low-level signal is outputted from first differential output terminal 11. Accordingly, n-channel MOS transistors M101 and M103 each enter a nonconductive state, and p-channel MOS transistors M105 and M106 also enter a nonconductive state. In addition, because bipolar transistor Q102 is in a nonconductive state, a high-level signal is outputted from second differential output terminal 12, n-channel MOS transistors M102 and M104 both enter a conductive state, and a low-level signal is outputted from output terminal OUT.

On the other hand, when a low-level signal at CML amplitude is inputted to the positive input terminal IN of differential circuit 10 and a high-level signal at CML amplitude is inputted to inverted input terminal INB, bipolar transistor Q101 connected to positive input terminal IN enters a nonconductive state, and bipolar transistor Q102 connected to inverted input terminal INB enters a conductive state. Current then flows from power supply VDD to bipolar transistor Q102 by way of resistor R102, which is the load resistance, a low-level signal is outputted from second differential output terminal 12, and both of n-channel MOS transistors M102 and M104 enter a nonconductive state. In addition, since bipolar transistor Q101 is in a nonconductive state, a high-level signal is outputted from first differential output terminal 11. Accordingly, both of n-channel MOS transistors M101 and M103 enter a conductive state, both of p-channel MOS transistors M105 and M106 also enter a conductive state, and a high-level signal is outputted from output terminal OUT.

Figure 2:
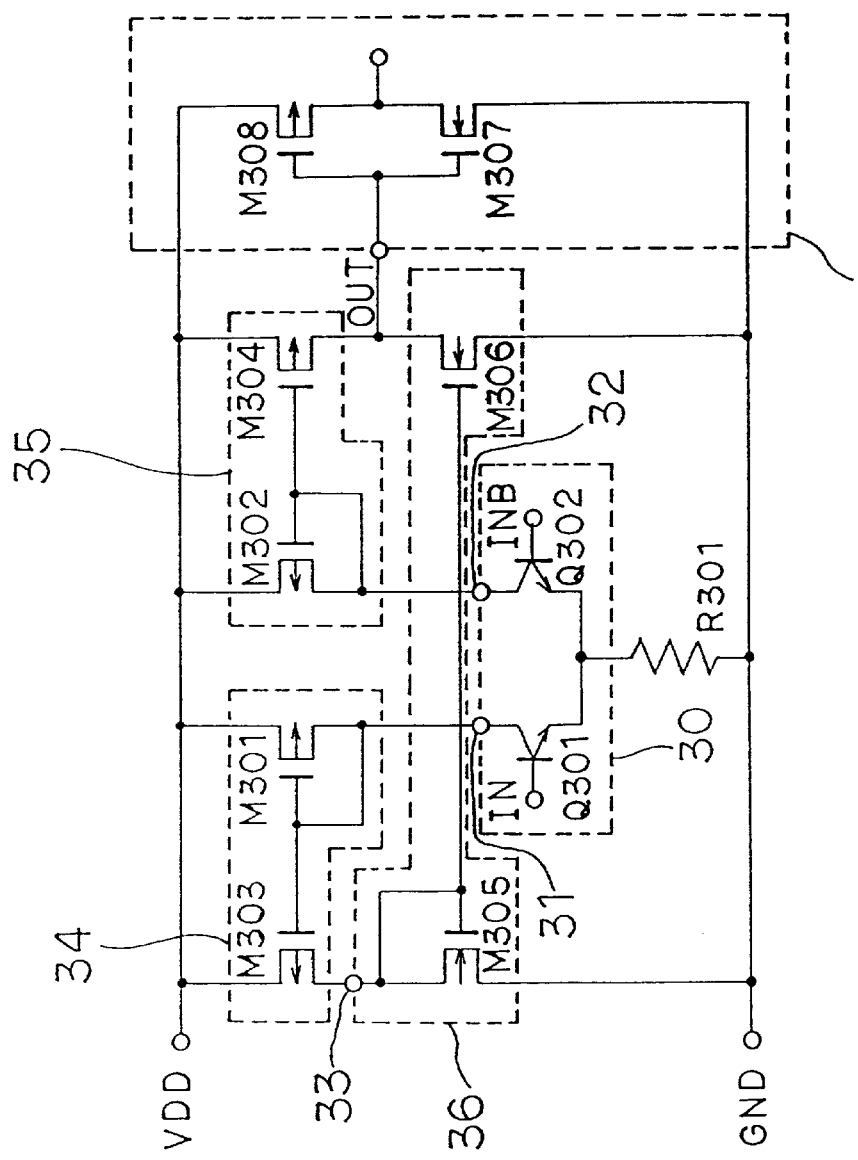
FIG. 2 is a circuit diagram showing another example of the configuration of a CML-CMOS conversion circuit of the prior art.

Here, variations occurs in the current that flows to differential circuit 10 because the output of differential circuit 10 in the CML-CMOS conversion circuit of the present invention shown in FIG. 3 is connected to MOS transistors as in the CML-CMOS conversion circuit of the prior art shown in FIG. 2. Nevertheless, the voltage of output terminal OUT is determined in accordance with the conductive/nonconductive states of p-channel MOS transistor M108 and n-channel MOS transistor M107, and as a result, the voltage amplitude inputted to CMOS inverter 17 is stable.

The effect of variations in the characteristics of each element in the CML-CMOS conversion circuit shown in FIG. 3 is next examined.

First, if variation in the threshold voltage $V_T$ of n-channel MOS transistor M101 is taken into consideration, the output voltage of first differential output terminal 11 must be set to 0.4 [V] or less in order to place n-channel MOS transistor M101 in a nonconductive state when bipolar transistor Q101 is in a conductive state. Similarly, if variation in the threshold voltage $V_T$ of n-channel MOS transistor M102 is taken into consideration, the output voltage of second differential output terminal 12 must be set at 0.4 [V] or less in order to place n-channel MOS transistor M102 in a nonconductive state when bipolar transistor Q102 is in a conductive state.

On the other hand, if variation in the threshold voltage $V_T$ of n-channel MOS transistor M101 is taken into consideration, the output voltage of first differential output terminal 11 must be made at least 0.7 [V] in order to place n-channel MOS transistor M101 in a conductive state when bipolar transistor Q101 is in a nonconductive state. Similarly, if variation in the threshold voltage $V_T$ of n-channel MOS transistor M102 is taken into consideration, the output voltage of second differential output terminal 12 must be made at least 0.7 [V] in order to place n-channel MOS transistor M102 in a conductive state when bipolar transistor Q102 is in a nonconductive state.

Here, the use of resistor R101 as the load of bipolar transistor Q101 and resistor R102 as the load of bipolar transistor Q102 in the present invention allows the low-level voltage outputted from first differential output terminal 11 and second differential output terminal 12 to be easily set to the order of 0.1–0.2 [V]. In other words, the low-level voltage inputted to n-channel MOS transistors M101 and M102 can be easily set to 0.4 [V] or less.

In addition, due to the large input impedance of n-channel MOS transistor M101 connected to first differential output terminal 11 and n-channel MOS transistor M102 connected to second differential output terminal 12, the high-level voltage outputted from first differential output terminal 11 and second differential output terminal 12 is a value substantially equivalent to power supply VDD. Accordingly, the high-level voltage inputted to n-channel MOS transistors M101 and M102 can be made 0.7 [V] or greater even if the voltage of power supply VDD is on the order of 1 [V].

As a result, a CML-CMOS conversion circuit can be realized that can operate without problems even when only a low power supply voltage such as from a battery (with a power supply voltage of 1 [V]) is available.

In addition, in contrast with a case in which the output voltage is received by bipolar transistors, the output voltage of first differential output terminal 11 and second differential output terminal 12 is received by n-channel MOS transistors, and as a result, the drop in frequency characteristic or occurrence of latch-up resulting front saturation of the bipolar transistors can be avoided, and a CML-CMOS conversion circuit that operates at high speed can be realized.

While a preferred embodiment of the present invention has been described using specific terms, such description is for illustrative purposes only, and it is to be understood that changes and variations may be made without departing from the spirit or scope of the following claims.

What is claimed is:

1. A CML-CMOS conversion circuit that converts input signals complementary-inputted at CML (Current Mode Logic) amplitude into signals of CMOS (Complementary Metal Oxide Semiconductor) logic amplitude and outputs a result, comprising:
    a differential circuit that is connected to resistors that function as load and that amplifies and complementary-outputs a difference in potential between a positive input signal, which is one signal of said input signals, and an inverted input signal, which is another signal of said input signals;
    a first current mirror circuit that is connected to one output of said differential circuit;
    a second current mirror circuit that is connected to the other output of said differential circuit;
    a third current mirror circuit that is provided with a first transistor connected in a series to the output of said first current mirror circuit and a second transistor connected in a series with the output of said second current mirror circuit, wherein said second transistor enters a conductive state when current flows to said first transistor and said second transistor enters a nonconductive state when current does not flow to said first transistor; and
    a CMOS inverter that is provided with a p-channel MOS transistor and a first n-channel MOS transistor that are in complementary connection, that takes as input a signal outputted from said second current mirror circuit, and that outputs a signal at CMOS logic amplitude.

2. The CML-CMOS conversion circuit according to claim 1 wherein said differential circuit comprises:
    a first bipolar transistor into which said positive input signals are inputted, and having a first resistor is connected as load between the collector and the power supply terminal; and
    a second bipolar transistor into which said inverted input signals are inputted, and having its emitter connected in common with the emitter of said first bipolar transistor and a second resistor is connected as load between the collector and the power supply terminal.

3. The CML-CMOS conversion circuit according to claim 1 wherein said first current mirror circuit is provided with:
    a second n-channel MOS transistor connected to one output of said differential circuit; and
    a third n-channel MOS transistor having its gate connected in common with the gate of said second n-channel MOS transistor;
    wherein said third n-channel MOS transistor enters a conductive state when current flows to said second n-channel MOS transistor, and said third n-channel MOS transistor enters a nonconductive state when current does not flow to said second n-channel MOS transistor.

4. The CML-CMOS conversion circuit according to claim 1 wherein said second current mirror circuit is provided with:
    a second n-channel MOS transistor connected to the other output of said differential circuit; and
    a third n-channel MOS transistor having its gate connected in common with the gate of said second n-channel MOS transistor;
    wherein said third n-channel MOS transistor enters a conductive state when current flows to said second n-channel MOS transistor, and said third n-channel MOS transistor enters a nonconductive state when current does not flow to said second n-channel MOS transistor.

5. The CML-CMOS conversion circuit according to claim 1 wherein said first transistor and said second transistor are each p-channel MOS transistors.

6. The CML-CMOS conversion circuit according to claim 2 wherein:
    the resistance of said first resistor is set such that the output voltage of the collector of said first bipolar transistor is 0.4 V or less when said first bipolar transistor is in an conductive state; and
    the resistance of said second resistor is set such that the output voltage of the collector of said second bipolar transistor is 0.4 V or less when said second bipolar transistor is in a conductive state.

* * * * *